United States Patent
Czamara et al.

(10) Patent No.: US 9,720,461 B2
(45) Date of Patent: Aug. 1, 2017

(54) CARRIER WITH ADJUSTABLE HEAT REMOVAL ELEMENTS

(71) Applicant: Amazon Technologies, Inc., Reno, NV (US)

(72) Inventors: Michael Phillip Czamara, Seattle, WA (US); Osvaldo P. Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 59 days.

(21) Appl. No.: 14/336,838

(22) Filed: Jul. 21, 2014

(65) Prior Publication Data

US 2014/0326436 A1    Nov. 6, 2014

Related U.S. Application Data

(63) Continuation of application No. 13/236,212, filed on Sep. 19, 2011, now Pat. No. 8,787,013.

(51) Int. Cl.
*G06F 1/20*  (2006.01)
*H05K 7/20*  (2006.01)

(52) U.S. Cl.
CPC ........... *G06F 1/20* (2013.01); *H05K 7/20727* (2013.01)

(58) Field of Classification Search
CPC ....... G06F 1/20; G06F 2200/201; H05K 7/20; H05K 7/20218; H05K 7/2039; H05K 7/20536; H05K 7/20727; H05K 7/20781
USPC ...... 361/676–678, 679.46–679.54, 688–723; 361/831; 165/67, 104.33, 121, 178; 312/236, 223.1
See application file for complete search history.

(56) References Cited

U.S. PATENT DOCUMENTS

| | | | |
|---|---|---|---|
| 5,370,178 A * | 12/1994 | Agonafer | H01L 23/467 165/137 |
| 5,615,084 A | 3/1997 | Anderson et al. | |
| 7,278,273 B1 | 10/2007 | Whitted et al. | |
| 7,324,341 B2 | 1/2008 | Oman | |
| 7,347,251 B2 | 3/2008 | Foster, Sr. et al. | |
| 7,599,184 B2 | 10/2009 | Upadhya et al. | |
| 8,305,754 B2 * | 11/2012 | Wu | H05K 7/20781 165/104.21 |

(Continued)

FOREIGN PATENT DOCUMENTS

EP    0054597    6/1982

OTHER PUBLICATIONS

U.S. Appl. No. 13/236,212, filed Sep. 19, 2011, Michael P. Czamara.

*Primary Examiner* — Courtney Smith
*Assistant Examiner* — Zhengfu Feng
(74) *Attorney, Agent, or Firm* — Robert C. Kowert; Meyertons, Hood, Kivlin, Kowert & Goetzel, P.C.

(57) ABSTRACT

A system for removing heat from a computing device includes a carrier and one or more heat removal elements. The carrier includes a carrier surface having a carrier surface pattern. The carrier surface pattern includes coupling portions. The coupling portions of the carrier surface pattern selectively couple, at different locations on the pattern, the heat removal elements to the carrier. The heat removal elements conduct heat from heat producing components of the computing device to the carrier. The carrier conducts heat away from the heat removal elements.

19 Claims, 7 Drawing Sheets

(56) References Cited

U.S. PATENT DOCUMENTS

| | | | | |
|---|---|---|---|---|
| 8,820,395 B2* | 9/2014 | Yatskov | ............... | F28D 1/0426 |
| | | | | 165/176 |
| 2004/0008483 A1* | 1/2004 | Cheon | ..................... | G06F 1/20 |
| | | | | 361/679.53 |
| 2005/0241812 A1* | 11/2005 | Malone | ............... | F28D 1/0477 |
| | | | | 165/150 |
| 2007/0297136 A1* | 12/2007 | Konshak | ............ | H05K 7/20772 |
| | | | | 361/699 |
| 2008/0205003 A1 | 8/2008 | Belady | | |
| 2008/0259566 A1* | 10/2008 | Fried | ................. | F28D 15/0266 |
| | | | | 361/699 |
| 2009/0225514 A1 | 9/2009 | Correa et al. | | |
| 2009/0262495 A1* | 10/2009 | Neudorfer | ............... | G06F 1/20 |
| | | | | 361/679.47 |
| 2010/0059201 A1 | 3/2010 | Masto et al. | | |
| 2011/0164384 A1* | 7/2011 | Vogel | .................... | F28D 1/024 |
| | | | | 361/696 |
| 2012/0019115 A1* | 1/2012 | Dunwoody | ........... | H05K 7/1488 |
| | | | | 312/236 |
| 2013/0308267 A1* | 11/2013 | Wu | ......................... | G06F 1/20 |
| | | | | 361/679.53 |

\* cited by examiner

CARRIER WITH ADJUSTABLE HEAT REMOVAL ELEMENTS

This application is a continuation of U.S. patent application Ser. No. 13/236,212, filed Sep. 19, 2011, now U.S. Pat. No. 8,787,013, which is hereby incorporated by reference in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Computer systems typically include a number of components that generate waste heat. Such components include processors, mass storage devices, and power supplies. For example, some computers with multiple processors may generate 250 watts of waste heat. Typically, each chassis in the rack has air vents in the front and rear panels. An external cooling system causes air to flow through the front vents, over heat producing component in the rack, and out through the back vents. In many cases, heat sinks, heat pipes or other components are required to achieve an adequate cooling of the heat producing components of a system. External cooling systems, thermal management components, and the associated parts such as mounting brackets, spring clips, and fasteners, add cost and complexity to a system.

In a typical computing device, the highest heat-generating components and most sensitive components are located at a few locations in the device. Thus, cooling needs are not evenly distributed over the computing device, but are instead concentrated at particular locations. The location of the highest heat-generating components in rack mounted computing devices (such as rack-mounted servers) varies across different models of computing devices. For example, in one rack-mounted server model, the central processing units may be in the front left corner of the server, while in another rack-mounted server model, the central processing unit may be in the right rear corner of the server.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times.

Figure 1:
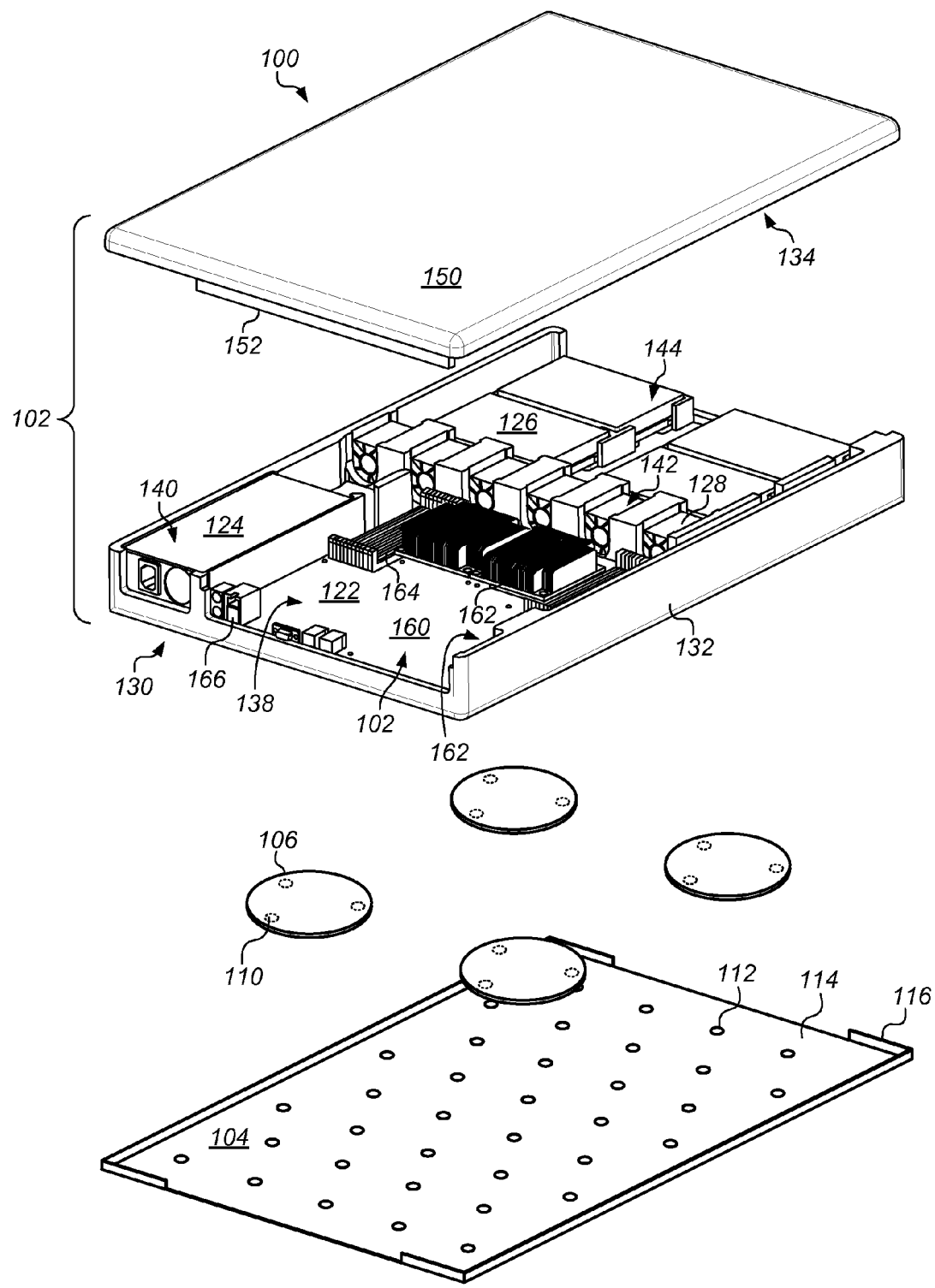
FIG. 1 is a partially exploded view illustrating one embodiment of a system including a tray with heat removal elements for removing heat from components on a computing device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods for removing heat from electrical systems are disclosed. According to one embodiment, a system for removing heat from a computing device includes a carrier and one or more heat removal elements. The carrier includes a carrier surface having a carrier surface pattern. The carrier surface pattern includes coupling portions. The coupling portions of the carrier surface pattern selectively couple, at different locations on the pattern, the heat removal elements to the carrier. The heat removal elements conduct heat from heat producing components of the computing device to the carrier. The carrier conducts heat away from the heat removal elements.

According to one embodiment, a system for removing heat from electrical systems in a rack includes a tray and one or more heat removal elements. The tray supports the electrical system in the rack. The heat removal elements couple with the tray at one or more locations on a surface of the tray. The heat removal elements conduct heat from heat producing components of the electrical systems to the tray. The tray conducts heat away from the heat removal elements.

According to one embodiment, a system for removing heat from computing devices includes one or more trays, one or more heat removal elements, and one or more shafts. The trays support computing devices in a rack. The heat removal elements couple at one or more locations on a surface of the trays. The shafts couple with the trays. The heat removal elements conduct heat from heat producing components of the computing devices to the tray. The trays transfers heat from the heat removal elements to the shafts.

According to one embodiment, a method of removing heat from an electrical system includes positioning heat removal elements on a surface of a carrier. The carrier includes a carrier surface pattern configured to selectively couple the heat removal elements at different locations on the carrier surface pattern. Heat removal elements are coupled to the surface of the carrier. The carrier is coupled with the electrical system such that the heat removal elements carry heat away from heat producing components of the electrical system.

As used herein, a "carrier" includes any member or combination of members on which an element or combination of elements (such as a heat removal elements) can be at least partially supported or located. Examples of a carrier include a tray, a cover, a rail, a lid, or a panel. In some embodiments, a carrier establishes and maintains the position of or more elements connected to the carrier. For example, a cover for a computing device may establish the position of heat removal elements on a surface of the cover.

As used herein, a "heat removal element" means any element that can remove heat away from one or more heat producing components. A heat removal element may have a direct or an indirect connection with heat producing components. In some embodiments, a heat removal element transfers heat to surrounding air. In some embodiments, a heat removal element transfers heat to one or more thermally conductive elements. Examples of heat removal elements include discs, bars, plugs, pins, plates, heat sinks, tubes, and heat pipes.

As used herein, a "shaft" includes any member or combination of members that can extend over two or more slots of a rack. Examples of shafts include a bar, plate, an extruded member, a tube, a rod, or combinations thereof. In some embodiments, a shaft includes heat-dissipating elements, such as fins or pins. In some embodiments, a shaft holds or carries one or more fluids into which heat can be rejected.

As used herein, a "tray" includes any member or combination of members on which an element or combination of elements (such as a computing device) can be rested and transported from one place to another. Examples of a tray include a sheet, a plate, a bar, a rail, or combinations of one or more such elements.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. A chassis may be made of any material, including metal, a polymeric material such as PVC, or combinations thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, two elements are physically "coupled" to one another if they are in contact, connected to one another, or maintained in a fixed relationship to one another. Elements may be coupled to one another by the elements themselves, by additional elements (such as fasteners or a cover panel), or combinations thereof. Elements may be coupled directly or indirectly (for example, by way of an intervening link or plate.)

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "member" includes a single element or a combination of two or more elements (for example, a member can include two or more sheet metal parts fastened to one another).

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, a "rack" means a rack, container, frame, or other element or combination of elements that can contain or physically support one or more computer systems.

As used herein, a "shelf" means any element or combination of elements on which an object can be rested. A shelf may include, for example, a plate, a sheet, a tray, a block, a grid, or a box. A shelf may be rectangular, square, round, or another shape. In some embodiments, a shelf may be one or more rails.

As used herein, a "socket" means includes any portion of a member that can receive at least a portion of another member. In one embodiment, a socket is a hole in sheet metal into which a pin can be inserted.

As used herein, a "space" means a space, area or volume.

In various embodiments, computing devices are supported on thermally conductive trays. The trays may be mounted in a rack. The trays hold heat removal elements (such as metal discs) that can be selectively positioned on the trays. The heat removal elements can be positioned, for example, near high heat producing components to enhance cooling of the computing device. The trays for the computing devices may be coupled to a common shaft such that heat can be transferred from the trays to the shaft.

FIG. 1 is a partially exploded view illustrating one embodiment of a system including a tray with heat removal elements for removing heat from components on a computing device. System 100 includes computing device 102, tray 104, and heat removal elements 106. In some embodiments, tray 104 is used to mount computing device 102 in a rack.

Heat removal elements 106 may be held between tray 104 and the bottom of computing device 102. Heat removal elements 106 may thermally couple with heat producing components on computing device 104. In some embodiments, heat removal elements are in direct contact with a heat producing component, such as a central processing unit. In other embodiments, heat removal elements thermally couple with a heat producing component by way of one or more intermediate components or materials. For example, a heat removal element may be thermally coupled to a semiconductor device through a printed circuit board. Heat may transfer through a circuit board by way of vias, metallic layers, the substrate of the circuit board, or a combination thereof. In certain embodiments, a printed circuit board includes thermally conductive inserts or pins to carry heat from one side of the circuit board to a heat removal element on the opposite side of the circuit board.

In certain embodiments, thermally conductive materials are included in a system to improve thermal performance. For example, a thermal interface material or thermal grease may be placed between a heat removal element and a heat producing component.

Heat removal elements 106 may be positioned on tray 104. Heat removal elements 106 include projections 110. Tray 104 includes sockets 112. Each of projections 110 on heat removal element 106 may couple in one of sockets 112 on tray 104. Projections 110 on heat removal elements 106 may be arranged in a pattern. Sockets 112 on tray 104 may be arranged in a pattern. The pattern of projections 110 on heat removal elements 106 may match the pattern of sockets 112 on tray 104, such that projections 110 couple in sockets 112. Each of heat removal elements 106 can be selectively positioned across tray 104 to align projections 110 of the heat removal element with a corresponding set of sockets 112 on tray 104. Once in a desired position, the set of projections 110 on the heat removal element can couple in one of the corresponding set of sockets 112.

Tray 104 includes base plate 114 and rim 116. Computing device 102 may rest on base plate 114. Rim 116 may align computing device 102 on tray 104. Computing device 102 may be mounted on tray 104 in a rack. For example, tray 104 may rest on a pair of opposing angle rails or slides in a rack. As another example, tray 104 may rest on a shelf in a rack.

In some embodiments, the location of heat removal elements is selected to correspond to heat producing elements of a computing device. For example, in the embodiment shown in FIG. 1, each of the forward pair of heat removal elements 106 may be at least partially aligned with one or more heat producing components of computing device 104, such as central processing units, power supply units, and hard disk drives.

Computing device 102 includes circuit board assembly 122, power supply unit 124, hard disk drives 126, fans 128, and chassis 130. Circuit board assembly 122, power supply unit 124, hard disk drives 126, and fans 128 are coupled to, and supported by, chassis 130.

Chassis 130 includes chassis base 132 and chassis lid 134. Chassis base 132 also includes circuit board seat 138, power supply seat 140, fan seats 142, and hard disk drive seats 144.

Chassis lid 134 includes top panel 150 and lip 152. Chassis lid 134 may couple with chassis base 132. Chassis lid 134 and chassis base 132 may form an enclosure for circuit board assembly 122 and related components of computing device 102.

In some embodiments, chassis 130 is made of a shock-absorbing material. Chassis 130 may protect circuit board assembly 122 and other components mounted in or on chassis 130 from damage due to shock and vibration, either during operation of the computer system or during shipping of the system. In some embodiments, chassis 130 is at least partially made of a polymeric material. In some embodiments, chassis 130 is an expanded foam material, such as an expanded foam polypropylene. In certain embodiments, only part of a chassis may be made of a shock-absorbing polymer material. For example, chassis body may be made of a shock-absorbing polymer material, and a chassis lid may be made of sheet metal. In other embodiments, a chassis is made entirely of metal. Moreover, in certain embodiments, a shock-absorbing chassis may include structurally reinforcing members such as ribs, beams, rods, straps, or grids. Reinforcing members may be external (such as an exoskeleton or external shell), internal (such as rods extending through a body of the chassis), or a combination thereof. Portions of a chassis may be produced by various manufacturing processes, including molding, casting, machining, extruding, or cutting. In one embodiment, chassis body 132 and chassis lid 134 are injection molded. Cutouts may be provided in chassis to provide access to components or cable runs, or to accommodate additional components such as heat sinks or heat pipes.

Circuit board assembly 122 includes circuit board 160, processors 162, DIMM slots 164, and I/O connectors 166. Circuit board assembly 122 may include various other semiconductor devices, resistors, and other heat producing components. Circuit board assembly 122, in conjunction with other components in chassis 130 (hard disk drives, power supplies) and/or components external to chassis 130, may operate in conjunction with one another as a computer system. For example, computing device 104 may be a file server.

In the embodiment shown in FIG. 1, heat removal elements 106 are illustrated as circular discs. Heat removal elements may, however, in various embodiments, be any shape or size. Examples of shapes of a heat removal element include square, rectangular, ovate, triangular, hexagonal or irregular. In certain embodiments, the shape of the heat removal elements may allow two heat removal elements to be clustered in a particular region of a system. For example, a set of hexagonal elements of identical size and shape may be tiled, one next to another on a portion of a tray.

In some embodiments, a heat removal system for a device includes heat removal elements of different shapes and sizes installed on a common carrier. The shapes and sizes may be selected based on the location and heat generating characteristics of heat producing components in a system. For example, a system may include a large heat removal element corresponding to the location of a central processing unit, and a small heat removal element corresponding to the location of a hard disk drive.

Figure 2:
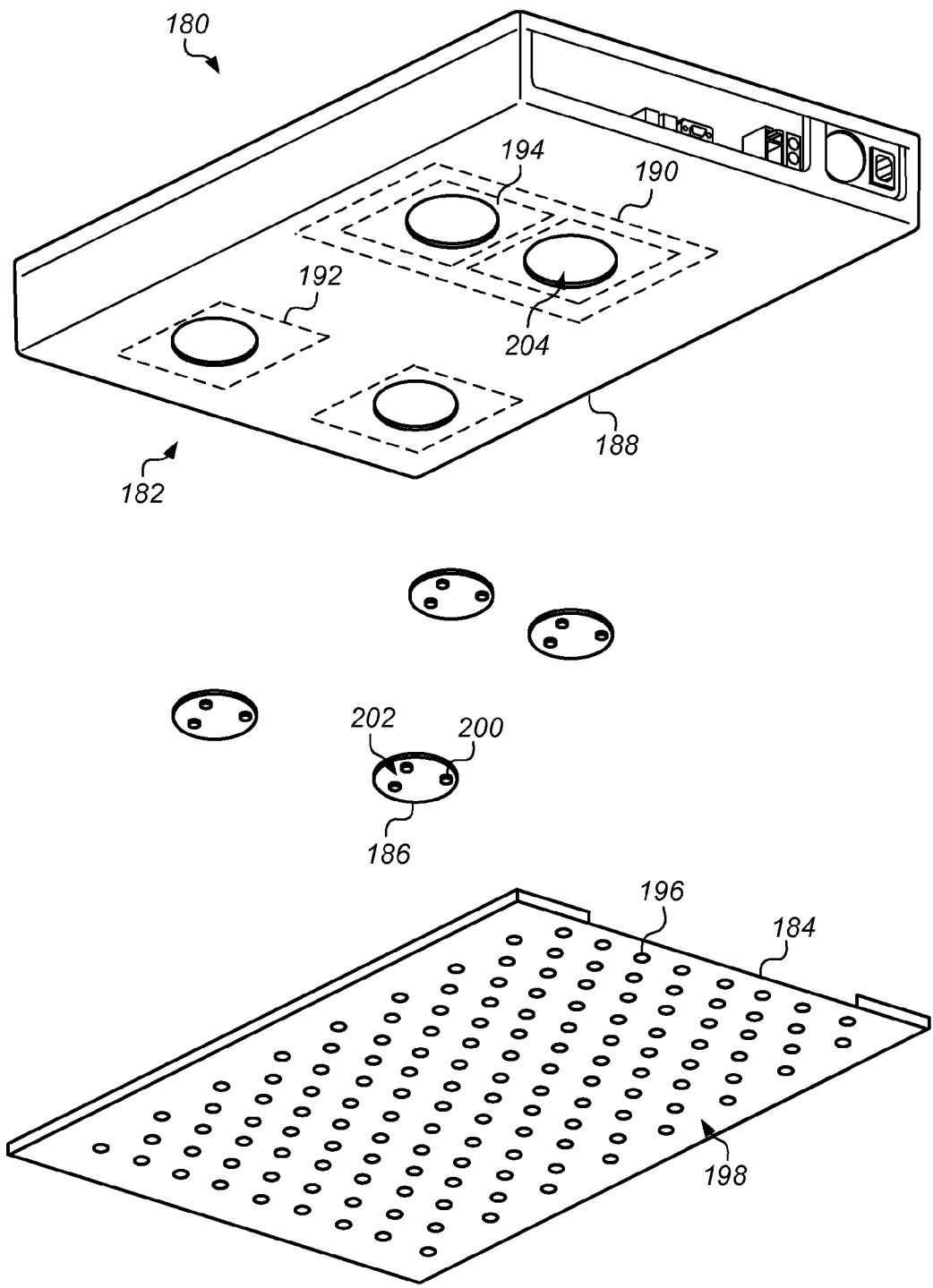
FIG. 2 illustrates one embodiment of a computing device chassis having openings for heat removal elements.

In some embodiments, a chassis includes openings to accommodate heat removal elements between heat producing elements of a computing device and a carrier for the heat removal elements. FIG. 2 illustrates one embodiment of a computing device chassis having openings for heat removal elements. System 180 includes computing device 182, tray 184, and heat removal elements 186. Computing device 182 includes chassis 188. Chassis 188 houses circuit board 190 and hard disk drives 192. Circuit board 190 includes processors 194.

Heat removal elements 186 can be positioned on tray 184. Tray 186 includes sockets 196. Sockets 196 are arranged in pattern 198. Heat removal elements 186 include projections 200. Projections 200 are arranged in pattern 202. Pattern 202 of projections 200 may match pattern 198 of sockets, such that heat removal elements 186 can be coupled to tray 186 at selected locations on pattern 198 of tray 186.

Chassis 188 includes openings 204. Each of openings 204 may accommodate one of heat removal elements 186. When computing device 182 is in an installed position on tray 184, each of heat removal elements 186 may reside in a corresponding one of openings 204. Each of heat removal elements 186 may thermally couple one or more heat producing components, such as one of processors 194, to tray 184. Tray 184 may carry heat from heat removal elements 186 and dissipate the heat to the air surrounding tray 184, to other heat conducting elements thermally coupled to tray 184, or a combination of both.

In the embodiment shown in FIG. 2, the size and shape of each of openings 204 generally corresponds to the size and shape of a heat removal element. Openings for heat removal elements may, however, be any suitable shape and size. For example, an opening for heat removal elements may be slot that runs the entire length of a chassis.

Figure 3:
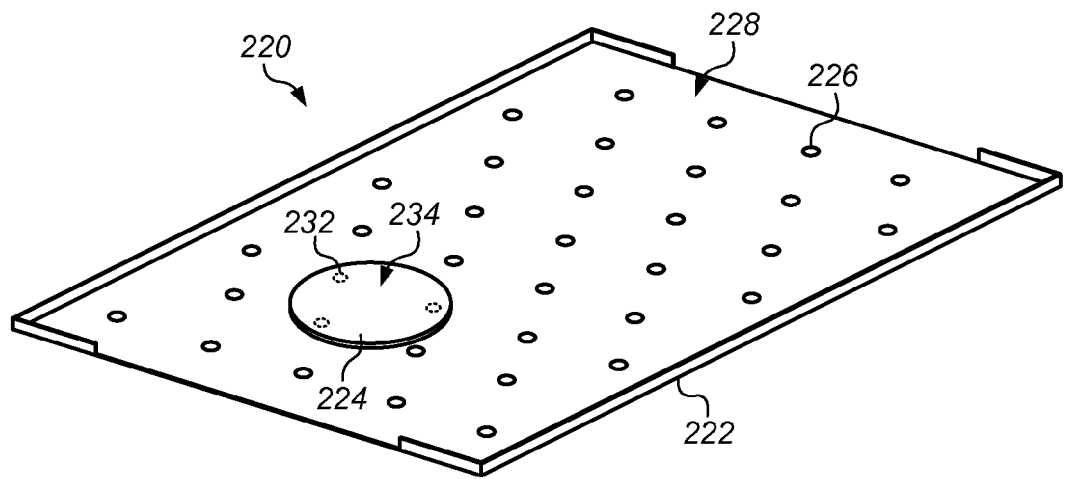
FIG. 3 illustrates an embodiment of a heat removal element coupled to a tray.

FIG. 3 illustrates an embodiment of a heat removal element coupled to a tray. Heat removal system 220 includes tray 222 and heat removal element 224. Tray 222 includes holes 226. Holes 226 are arranged in pattern 228. Holes 226 may be, in various embodiments, through holes, blind holes, or a combination thereof.

Figure 4:
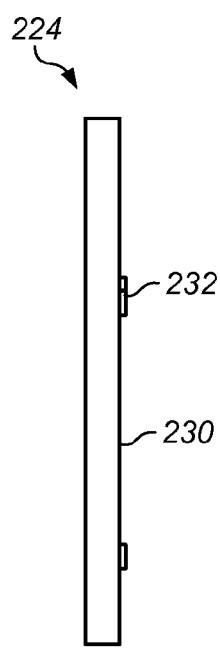
FIG. 4 illustrates a side view of a heat removal element.
Figure 5:
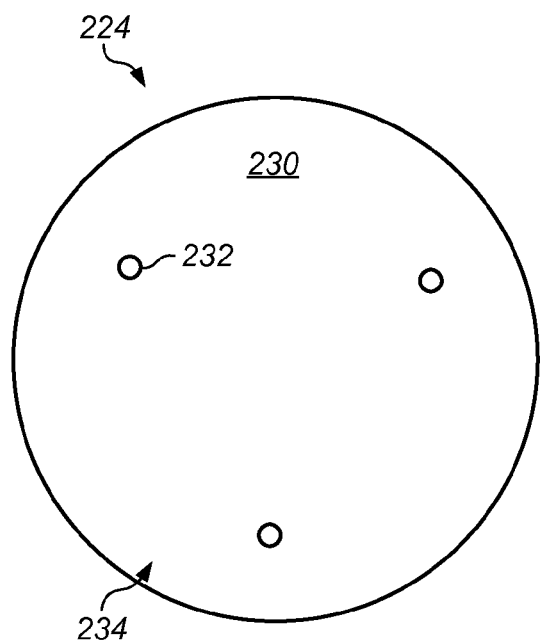
FIG. 5 illustrates a top view of a heat removal element.

FIG. 4 illustrates a side view of a heat removal element. FIG. 5 illustrates an top view of a heat removal element. Heat removal element 224 includes body 230 and pins 232. A portion of pins 232 may protrude from body 230. In one embodiment, pins 232 have a diameter of about 0.25 inches project about 0.375 inches from the face of body 230. Pins 232 are arranged in pattern 234 on body 230.

Pattern 234 of pins 232 may match pattern 228 on tray 222. Heat removal element 224 may be coupled to tray 222 by lining up pins 232 with corresponding holes 226.

Heat removal element and carriers may be made of any suitable materials.

Heat removal elements and carriers may be made, at least in part, materials that have are thermally conductive. In one embodiment, tray 222 is made of 5051 aluminum, body 230 of heat removal element is made of 1050A aluminum, and pins 232 are cylindrical pins made of copper.

The fit between coupling portions of a heat removal system (for example, between projections 110 and sockets 112 shown in FIG. 1) may vary from embodiment to embodiment. The fit between projections 110 and sockets 112 may be, for example, a clearance fit, an interference fit, or a transition fit.

In the embodiment shown in FIGS. 1 through 3, the coupling of heat removal elements to a tray is accomplished by way of a projection/socket connection in which the projection is located on the heat removal element and the corresponding socket is located on the tray. In other embodiments, the arrangement of the projection and socket may be reversed at some or all of the coupling locations. Thus, a socket for a connection may be located on a heat removal element (such as heat removal element 106 shown in FIG. 1) and a corresponding pin may be located on carrier (such as tray 104 shown in FIG. 1). Other coupling systems may be used in various embodiments. Examples of coupling systems include threaded connections, hooks, interlocks, rims, or lips. In one embodiment, heat removal elements include threads that engage on complementary threads on a tray. For example, heat removal elements may include external threads that thread into the internal threads of a socket on the tray. In certain embodiments, a heat removal element may snap into a carrier.

In the embodiment shown in FIGS. 1, 2, and 3, sockets are arranged in a triangular pattern. Coupling elements on a carrier or a heat removal element may, however, be arranged in any suitable pattern. Examples of patterns include square, rectangular, and hexagonal. A pattern may have any suitable spacing of elements. Coupling elements arranged in a pattern with a relatively fine pitch (for example, more sockets per inch) may allow a user to more precisely locate a heat removal element on a surface.

Figure 6:
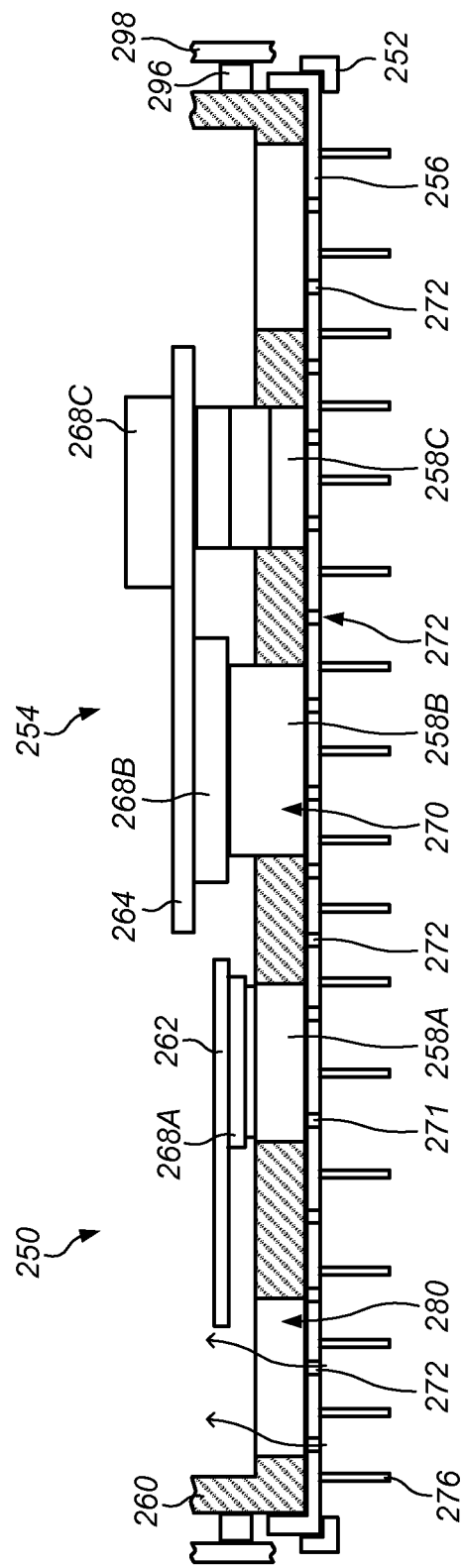
FIG. 6 is a front cross sectional view illustrating one embodiment of a rack-mounted tray supporting a computing device and heat removal elements.

In some embodiments, a heat removal system includes heat removal elements that couple with heat producing element at multiple elevations in a computing device. FIG. 6 is a front cross sectional view illustrating one embodiment of a rack-mounted tray supporting a computing device and heat removal elements. System 250 includes rack 252, computing device 254, tray 256, and heat removal elements 258A, 258B, and 258C. Computing device 254 is installed in rack 252. Computing device 254, tray 256, and heat removal elements 258A, 258B, and 258C may be similar to that described in FIG. 1. For example, heat removal elements 258A, 258B, and 258C may be circular discs.

Computing device 254 includes chassis 260, printed circuit board 262, and printed circuit board 264. Printed circuit boards 262 and 264 may be supported at different elevations on chassis 260. Printed circuit board 262 carries heat producing component 268A. Printed circuit board 264 carries heat producing components 268B and 268C.

Each of heat removal elements 258A, 258B, and 258C may couple with tray 256. Each of heat removal elements 258A, 258B, and 258C may extend through one of openings 270 in chassis 260. At each location, projections 271 on the heat removal elements may rest in a corresponding one of holes 272 in tray 256 arranged in a pattern on tray 256.

The heat removal elements may be of suitable height to couple with a corresponding heat producing element on computing device 250. For example, heat removal element 258A may thermally couple with heat producing component 268A, and heat removal element 258B may thermally couple with heat producing component 268B. The part selected for heat removal element 258B has a larger height than heat removal element 258A so that heat removal element 258B fills the larger gap between tray 256 and heat producing component 268B.

In some embodiments, two or more heat removal elements are stacked on one another to create a combined heat removal element of the appropriate height. For example, the three heat removal elements 258C are stacked to fill the gap between heat producing component 268C and tray 256.

In some embodiments, a carrier for heat removal elements includes elements for increasing heat transfer to surrounding air. For example, in the embodiment shown in FIG. 6, tray 256 includes fins 276. In one embodiment, fins extend the length of tray 256.

In some embodiments, holes in pattern on a carrier also provide ventilation to promote air flow through a computing device on the tray. The holes may be, for example, holes in a pattern that are unused for coupling heat removal elements. For example, as shown in FIG. 6, air may flow upwardly through holes 272 through apertures 280.

Figure 7:
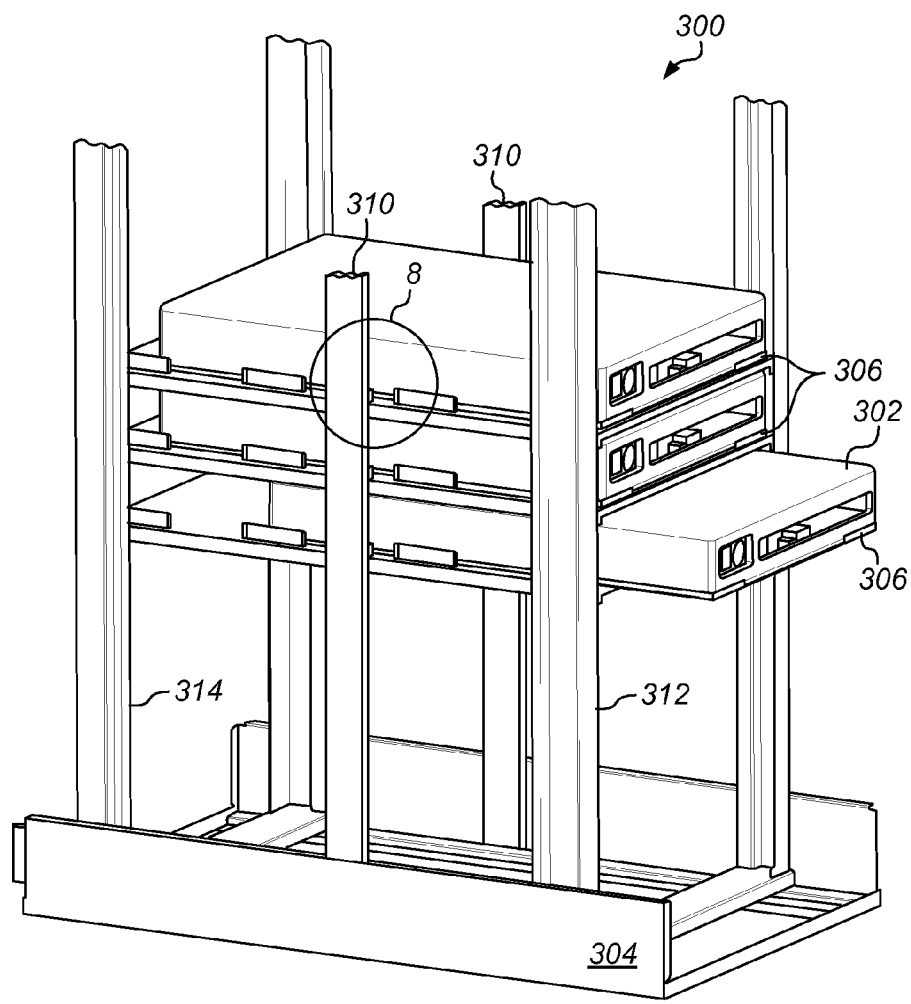
FIG. 7 illustrates one embodiment of a rack including shafts for receiving heat from computing device trays.

In some embodiments, a carrier for heat removal elements transfers heat to other members in a rack. In one embodiment, trays in a rack reject heat into one or more shafts. The shafts may run, for example, along one or more of the sides of the rack. FIG. 7 illustrates one embodiment of a rack including shafts for receiving heat from computing device trays. System 300 includes computing devices 302 in rack 304. Computing devices 302 are supported on trays 306. Trays 306 may carry heat removal elements such as described above relative to FIGS. 1 through 6.

Shafts 310 are provided between front posts 312 and rear posts 314 of rack 304. Each of trays 306 for computing devices 302 may be thermally coupled to one or more of shafts 310. Shafts 310 may receive heat from trays 306. Shafts 310 may carry heat received from trays 302 away from trays 306.

Figure 8:
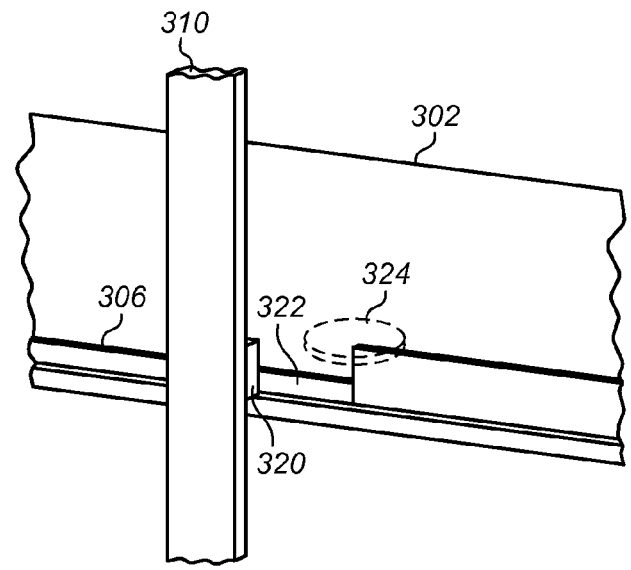
FIG. 8 is a detail view of one embodiment of a junction between a tray for a computing device and a heat-dissipating shaft.

FIG. 8 is a detail view of one embodiment of a junction between a tray for a computing device and a heat-dissipating shaft. Thermal connector 320 bridges a gap between shaft 310 and the lateral rim 322 of tray 306. Heat received from heat producing components by way of heat removal elements 324 may be transferred through thermal connector 320 to shaft 310.

In some embodiments, a tray is coupled to shafts on both the left and the right side of a rack. In certain embodiments, a shaft is provided at the front, rear, or both of a rack.

Figure 9:
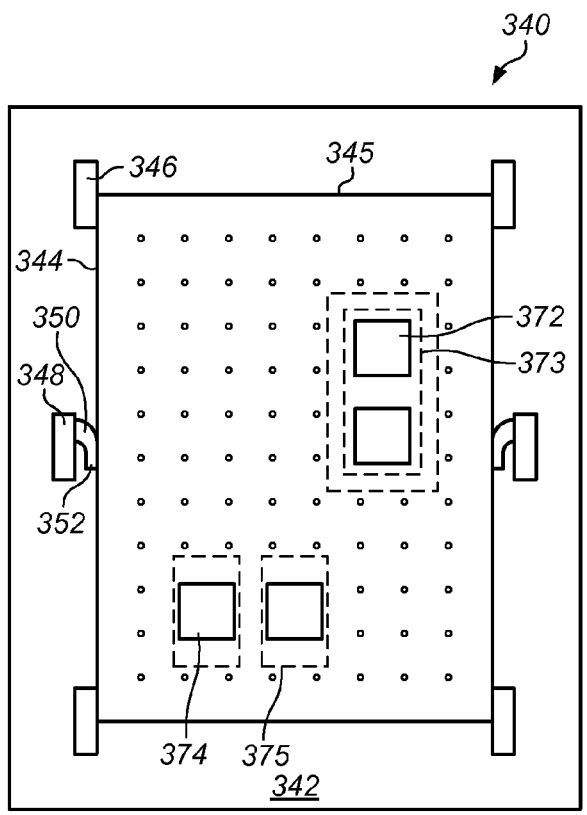
FIG. 9 is a schematic top view illustrating one embodiment of a connection between shafts on the sides of rack-mounted computing devices.

FIG. 9 is a schematic top view illustrating one embodiment of a connection between shafts on the sides of rack-mounted computing devices. System 340 includes rack 342 and computing device 344. Computing devices 344 are installed in trays 345 on posts 346. Mounting of computing devices 344 on posts 346 may be, for example, by way of shelves, angle guides, or slides. Shafts 348 are provided on either side of computing devices 344. Thermal connectors 350 are provided between trays 345 and shafts 348. In one embodiment, thermal connectors 350 are provided at each position (for example, each slot) in a rack. Thermal connectors 350 include arm 352. Thermal connectors 350 may transfer heat from trays 345 to shafts 348.

In some embodiments, all or part of a thermal connector is movable to establish thermal connection with a carrier in a rack. For example, arm 352 may be spring-loaded so that arm 352 swings inwardly and bears against one of trays 345. In certain embodiments, a user manually engages a thermal connector with each tray (for example, by manually extending an arm attached to the shaft).

In some embodiments, a shaft is adjustable relative to electrical systems in a rack. The shaft may be adjustable to move, for example, from front to back, side-to-side, up-and-down, and combinations thereof. For instance, a vertical shaft may be mounted to slide horizontally on a pair of fixed horizontal rails.

In one embodiment, a shaft is adjustable along the side of one or more computing devices. For example, referring to FIG. 9, shafts 348 may be adjustable by service personnel to move one or both of shafts 348 toward the front or back along the sides of computing devices 344. The position of a heat removal shaft in the rack may be chosen based on various considerations, such as the size or form factor of the computing device, or the location of heat generating components in the computing device (for example, where the high heat generating components are relative to the front of the device). In certain embodiments, a shaft on one side of rack may be adjusted to a different depth in a rack than a shaft on the other side of the rack. For example, the shaft on the right side of a rack may be positioned near the front of the rack, while a shaft on the left side of the may be positioned near the back of the rack.

In one embodiment, a shaft is positioned based on the depth of the servers installed in the rack. For example, if computing devices 344 are half-depth servers, shafts 348 may be adjusted forward such that the shaft is better positioned (for example, more centered from front to back) to remove heat from computing devices 344.

Although in examples shown in FIG. 9, only one heat removal shaft is shown on each side of the rack, a system may in various embodiments have any number of heat removal shafts on the sides of rack. In certain embodiments, heat removal shafts may be located on the front or rear of the computing devices.

Figure 10:
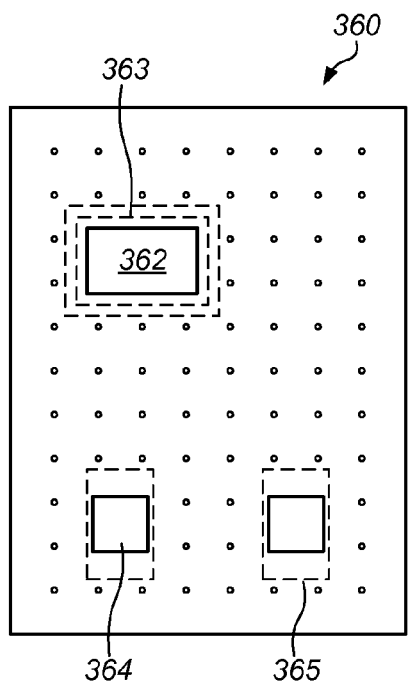
FIG. 10 and FIG. 11 illustrate arrangements of heat removal elements on a tray for two different computing devices.
Figure 11:
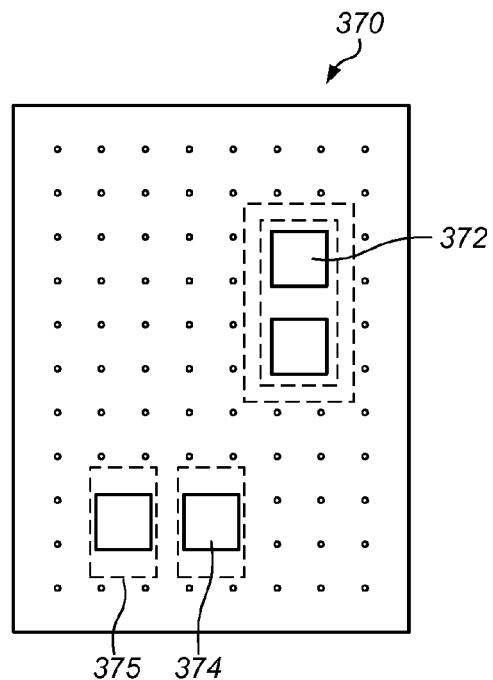

In some embodiments, the type, size, and arrangement of heat removal elements on a tray are chosen based on the characteristics of the computing device to be used with the tray. FIGS. 10 and 11 illustrate arrangements of heat removal elements on a tray for two different computing devices. In FIG. 10, system 360 includes heat removal element 362 for central processing unit 363 in the right front portion of the computing device and two heat removal elements 364 for hard disk drives 365. In FIG. 11, by contrast, system 370 includes two heat removal elements 372 for central processing unit 373 in the left front portion of the computing device and two heat removal elements 374 for hard disk drives 375 in the right rear corner of the computing device.

Figure 12:
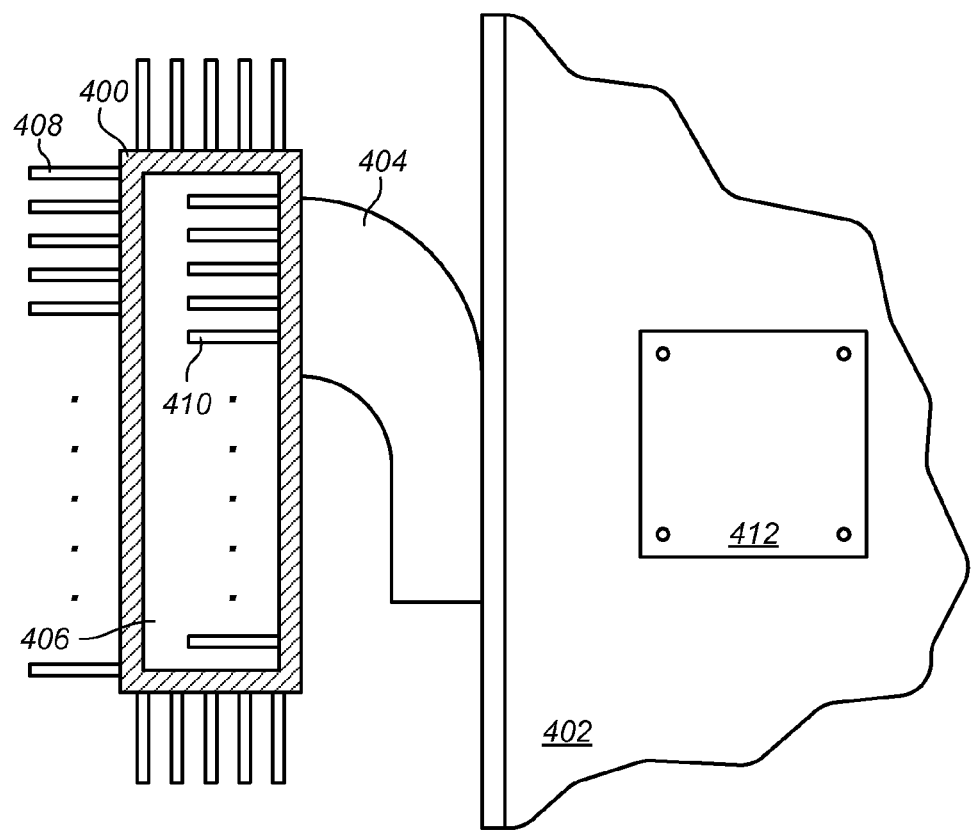
FIG. 12 is a cross sectional top view illustrating one embodiment of a hollow shaft with external fins and internal fins.

In various embodiments, a shaft dissipates heat received from heat producing components in a rack to ambient air or to fluid moving across or through the shaft. FIG. 12 is a cross sectional top view illustrating one embodiment of a hollow shaft with external and internal fins. Shaft 400 is coupled to tray 402 by way of thermal connector 404. Shaft 400 includes hollow interior passage 406. In one embodiment, shaft 400 is an extruded member. Interior passage 406 may carry moving air. In some embodiments, a cooling fluid (for example, air, another gas, or a liquid) is circulated through interior passage 406. Heat from heat producing components coupled to heat removal elements 412 may be conducted across tray 402 to shaft 400.

Shaft 400 includes external fins 408 and internal fins 410. External fins 408 may reject heat to air external to shaft 400. Internal fins 410 may reject heat to a fluid in interior passage 406.

In some embodiments, materials having different thermal conductivity are used for different components of a heat removal system. In one embodiment, the thermal conductivity of the heat removal system is progressively lower for components farther away from the heat producing components. For example, a heat removal system for servers in a rack may include heat removal elements made of copper, trays made of an aluminum alloy having a high thermal conductivity, and a shaft made of an aluminum alloy having relatively lower thermal conductivity.

In some embodiments, rack-mounted computing devices are commonly cooled by a cooling air system that delivers air to the rack. To remove heat from computing modules installed in the rack, an air handling system may be operated to cause air to flow in computer room and through the rack system. As the air reaches the front of each of computing modules, the air may pass through the chassis of the computing modules. After passing through the chassis, the heated air may exit the rear of the rack system and flow out of the computer room. In certain embodiments, computing modules have on board fans in addition to, or lieu of, a central cooling system. In certain embodiments, a rack may have a fan that supplies cooling air to all of the computing modules in the rack.

In some embodiments, a rack system includes rack-mounted fans external to computer systems in the rack. The rack-mounted fans may provide air flow through the computer systems.

Figure 13:
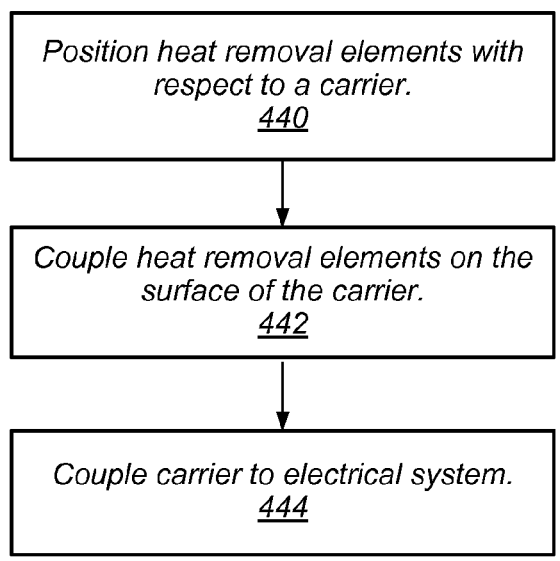
FIG. 13 illustrates one embodiment of removing heat from an electrical system using heat removal elements on a carrier.

In some embodiments, heat is removed from an electrical system using heat removal elements supported by a carrier. FIG. 13 illustrates one embodiment of removing heat from an electrical system using heat removal elements on a carrier. At 440, heat removal elements may be positioned on a carrier surface pattern of a carrier. The carrier may be, for example, a tray. The heat removal elements may be placed at positions that align the heat removal elements with heat producing components of the electrical system. In certain embodiments, heat removal elements are stacked, one on top of the other. Stacking heat removal elements may be used, for example, to achieve a desired height of the heat removal elements.

At 442, heat removal elements are coupled to the surface of a carrier. In one embodiment, projections on the heat removal elements are installed in matching sockets in the pattern.

At 444, the carrier is coupled to an electrical system. During operation of the electrical system, the heat removal elements may carry heat away from heat producing components of the electrical system.

In some embodiments, heat from trays in a server is rejected to a common shaft. In some embodiments, air or another fluid is moved over or through the shaft.

Although in many of the embodiments shown above, the carrier for the heat removal elements is a tray located below the heat producing components of the computing device, in various embodiments, a carrier for heat removal elements may in any location relative to the heat producing components, including above or on the side of the components. For example, in some embodiments, a carrier is provided as a cover or lid for a computing device.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for removing heat from computing devices, comprising:
   one or more trays mounted in a vertical arrangement in a rack, wherein:
   each tray of the one or more trays is arranged to support the computing devices at least partially mounted on an upper surface of the one or more trays in the rack, and
   each tray of the one or more trays is further arranged to conduct heat away from the computing devices at least partially mounted on the upper surface of the respective tray;
   one or more shafts extending vertically along one or more sides of the rack, wherein each shaft of the one or more shafts is arranged:
   to thermally couple with each of the one or more trays mounted in the rack, and
   to be adjusted along the one or more sides of the rack via sliding engagement of the one or more shafts on one or more horizontal rails;
   wherein each of the one or more trays is arranged to conduct heat to at least one of the one or more thermally coupled shafts;
   wherein the one or more shafts are arranged to transfer heat received
   from each of the one or more trays away from an entirety of the one or more trays.

2. The system of claim 1, further comprising at least one connector arranged to thermally couple at least one tray of the one or more trays to at least one shaft of the one or more shafts.

3. The system of claim 2, wherein the at least one connector comprises an adjustable arm arranged to swing inwardly, relative to the rack, to contact the at least one tray to thermally couple the at least one shaft with the at least one tray.

4. The system of claim 3, wherein the adjustable arm is spring-loaded, such that the adjustable arm is arranged to swing inwardly, relative to the rack, based at least in part upon the spring-loading of the adjustable arm.

5. The system of claim 1, wherein:
   each shaft of the one or more shafts comprises a hollow interior passage extending through a length of the respective shaft; and
   to transfer heat received from each of the one or more trays away from an entirety of the one or more trays, each shaft is arranged to reject heat received from the one or more trays into a fluid circulating through the hollow interior passage.

6. The system of claim 5, wherein:
each shaft comprises one or more fins projecting into the hollow interior passage of the respective shaft, wherein the one or more fins are arranged to reject heat from the respective shaft into the fluid circulating through the hollow interior passage.

7. The system of claim 5, wherein:
the fluid circulating through the hollow interior passage comprises air circulated through the hollow interior passage; and
the system comprises at least one air moving device arranged to move air to remove heat from at least one shaft of the one or more shafts.

8. The system of claim 5, comprising a fluid cooling system arranged to circulate the fluid to remove at least a portion of the heat from at least one of the one or more shafts.

9. A method, comprising:
mounting an electrical system on a carrier, wherein the carrier is arranged to conduct heat received from one or more heat producing components, such that:
the electrical system is at least partially mounted on an upper surface of the carrier, and
the carrier carries heat away from the one or more heat producing components of the electrical system via conduction between the one or more heat producing components and the carrier; and
thermally coupling one or more shafts to the carrier, wherein the one or more shafts are each arranged to:
conduct heat received from the carrier away from said carrier, such that the one or more shafts carries heat away from the carrier via conduction between the carrier and the one or more shafts, and
be adjusted along one or more sides of a rack via sliding engagement of the one or more shafts on one or more horizontal rails.

10. The method of claim 9, comprising: circulating a fluid such that the fluid removes heat from at least a portion of the one or more shafts, such that, to conduct heat received from the carrier away from said carrier, the at least one of the one or more shafts rejects heat into the circulated fluid.

11. The method of claim 10, wherein:
each of the one or more shafts comprises a hollow interior passage extending through a length of the respective shaft, and
to reject heat into the circulated fluid, the at least one of the one or more shafts rejects heat into a fluid circulating through the hollow interior passage of the respective shaft.

12. The method of claim 11, wherein the fluid circulating through the hollow interior passage comprises a liquid, such that the at least one of the one or more shafts rejects heat into the liquid circulating through the hollow interior passage of the respective shaft.

13. The method of claim 9, wherein thermally coupling one or more shafts to the carrier comprises adjusting a movable connector of the shaft to contact the carrier.

14. An apparatus, comprising:
a rack-mountable shaft arranged to:
couple to a rack and dissipate heat from each of one or more carriers mounted in the rack, and
be adjusted along one or more sides of the rack via sliding engagement of the shaft on one or more horizontal rails, wherein the shaft comprises:
a length of conductive material arranged to extend vertically along a side of the rack;
at least one thermal connector arranged to thermally couple the length of conductive material to the one or more carriers mounted in the rack, wherein each thermal connector is arranged to physically contact a separate carrier of the one or more carriers to thermally couple the respective carrier of the one or more carriers to the conductive material, such that heat transmitted to the one or more carriers from one or more heat producing components mounted to the one or more carriers is conducted from the one or more carriers to the conductive material via the thermal connector; and
a hollow interior passage extending through the length of the conductive material and arranged to accommodate one or more fluids, wherein the rack mountable shaft is arranged to reject heat into the one or more fluids circulating in the hollow interior passage.

15. The apparatus of claim 14, wherein the shaft comprises:
one or more fins coupled to an exterior of the length of conductive material and arranged to reject heat from the length of conductive material into an ambient environment.

16. The apparatus of claim 14, wherein the shaft comprises:
one or more fins coupled to an interior of the length of conductive material facing into the hollow interior passage, such that the one or more fins are arranged to reject heat from the length of conductive material into the one or more fluids circulating in the hollow interior passage.

17. The apparatus of claim 14, wherein the at least one thermal connector comprises an adjustable arm which is coupled to the length of conductive material and is arranged to swing away from the length of conductive material and contact at least one carrier of the one or more carriers mounted in the rack to thermally couple the length of conductive material to the at least one carrier of the one or more carriers.

18. The apparatus of claim 17, wherein the adjustable arm is spring-loaded, such that the adjustable arm is arranged to swing away from the length of conductive material and bear against the at least one carrier of the one or more carriers, based at least in part upon the spring-loading of the adjustable arm.

19. The apparatus of claim 14, wherein:
the hollow interior passage, to accommodate one or more fluids, is arranged to accommodate a liquid, such that the shaft is arranged to reject heat received from the one or more carriers into the liquid circulating through the hollow interior passage.

* * * * *